United States Patent
Luo

(10) Patent No.: US 9,658,259 B2
(45) Date of Patent: May 23, 2017

(54) SYSTEM FREQUENCY MEASUREMENT METHOD, SYNCHROPHASOR MEASUREMENT METHOD AND DEVICE THEREOF

(71) Applicant: Schneider Electric Industries SAS, Rueil Malmaison (FR)

(72) Inventor: Shanshan Luo, Shanghai (CN)

(73) Assignee: Schneider Electric Industries SAS, Rueil-Malmaison (FR)

( * ) Notice: Subject to any disclaimer, the term of this patent is extended or adjusted under 35 U.S.C. 154(b) by 947 days.

(21) Appl. No.: 13/951,143

(22) Filed: Jul. 25, 2013

(65) Prior Publication Data
US 2014/0032143 A1    Jan. 30, 2014

(30) Foreign Application Priority Data
Jul. 26, 2012   (CN) .......................... 2012 1 0262698

(51) Int. Cl.
*G01R 19/00* (2006.01)
*G01R 15/00* (2006.01)
(Continued)

(52) U.S. Cl.
CPC ........ *G01R 19/2513* (2013.01); *Y02E 60/728* (2013.01); *Y04S 10/265* (2013.01)

(58) Field of Classification Search
CPC ... G01R 19/2513; G01R 31/02; Y02E 60/728; Y04S 10/265
(Continued)

(56) References Cited

U.S. PATENT DOCUMENTS 6,662,124 B2 * 12/2003 Schweitzer, III .... H02H 1/0007
324/76.15
7,444,248 B2 * 10/2008 Premerlani ........ G01R 19/2513
702/64
(Continued)

FOREIGN PATENT DOCUMENTS

CN          1646927       7/2005
CN          202330589     7/2012

OTHER PUBLICATIONS

English Language Abstract of Chinese Patent Application Publication No. CN1646927—1 page.
(Continued)

*Primary Examiner* — An Do
(74) *Attorney, Agent, or Firm* — Locke Lord LLP

(57) ABSTRACT

Provided are a system frequency measurement method, synchrophasor measurement method and device. The synchrophasor measurement method comprises: sampling voltage and current signals based on an absolute time reference; removing out-of-band interference in the sampled voltage and current signals; first-resampling at least one of the voltage and current signals with the out-of-band interference being removed based on an estimated system frequency; calculating phasor for the signals obtained from the first resampling and updating the estimated system frequency; for a reporting timing, second-resampling the voltage and current signals with the out-of-band interference being removed based on the updated estimated system frequency; and calculating synchrophasor of the voltage and current signals obtained from the second resampling. The system frequency measurement method, synchrophasor measurement method and device are not only applicable to the stable operation of power systems but also to the dynamic opera-
(Continued)

tion thereof, and provide measurement result with high precision.

16 Claims, 5 Drawing Sheets

(51) Int. Cl.
    *G01R 13/02*     (2006.01)
    *G01R 19/25*     (2006.01)

(58) Field of Classification Search
    USPC ........................................ 702/57, 64, 65, 75
    See application file for complete search history.

(56) References Cited

U.S. PATENT DOCUMENTS

| | | | |
|---|---|---|---|
| 7,477,189 B2* | 1/2009 | Wang | G01S 19/235 342/357.62 |
| 8,108,165 B2* | 1/2012 | Benmouyal | G01R 19/2513 702/75 |
| 2003/0200038 A1 | 10/2003 | Schweitzer, III et al. | |

OTHER PUBLICATIONS

English Language Abstract of Chinese Patent Application Publication No. CN202330589—1 page.

English Language translation of First Office Action of Chinese Patent Application No. 201210262698.5—14 pages.

First Chinese Office Action dated Jul. 23, 2015 for Chinese Patent Application No. 201210262698.5 dated—13 pages.

Zolfaghari, R. et al., "Evaluation of windowed ESPRIT virtual instrument for estimating Power Quality Indices", Electric Power Systems Research 83 (2012), pp. 58-65.

Carta, A., et al., "GPS and IEEE 1588 synchronization for the measurement of synchrophasors in electric power systems", Computer Standards & Interfaces 33 (2011), pp. 176-181.

Warichet, J., et al., "Considerations about synchrophasors measurement in dynamic system conditions", Electrical Power and Energy Systems 31 (2009), pp. 452-464.

EPO Communication and Extended Search Report for European Application No. 13176147.0—Date of Completion of Search: Dec. 6, 2013, 10 pages.

Huang, Z. et al., "Performance Evaluation of Phasor Measurement Systems", IEEE Power Engineering Society General Meeting 2008, Pittsburgh, PA, 8 pages.

Huang, Z., et al, "Evaluation of PMU Dynamic Performance in Both Lab Environments and under Field Operating Conditions", Power Engineering Society General Meeting, IEEE, 2007, 6 pages.

Benmouyal, G. et al., "Synchronized Phasor Measurement in Protective Relays for Protection, Control, and Analysis of Electric Power Systems", Mar. 26, 2004, 16 pages.

Phadke, A.G., et al., "Synchronized Phasor and Frequency Measurement Under Transient Conditions", IEEE Transactions on Power Delivery, vol. 24, No. 1, Jan. 2009, 8 pages.

Akke, M., et al., "Sample Value Adjustment Improves Phasor Estimation at Off-Nominal Frequencies", IEEE Transactions on Power Delivery, vol. 25, No. 4, Oct. 2010, 10 pages.

Warichet, J., et al., "Considerations about synchrophasors measurement in dynamic system conditions", Electrical Power and Energy Systems 31, 2009, pp. 452-464.

"IEEE Standard for Synchrophasor Measurement for Power Systems", IEEE Std. C37.118.1TM-2011, Dec. 28, 2011, 60 pages.

* cited by examiner

Amplitude-frequency response of class M filter
for reporting rate of 60Hz

Amplitude-frequency response of class M filter
for reporting rate of 120Hz

Amplitude-frequency response of class M filter
for reporting rate of 120Hz

Amplitude-frequency response of class M filter
for reporting rate of 60Hz

SYSTEM FREQUENCY MEASUREMENT METHOD, SYNCHROPHASOR MEASUREMENT METHOD AND DEVICE THEREOF

FIELD OF INVENTION

The present invention relates to power system automatic measurement, and more specifically to a high-precision system frequency measurement method, synchrophasor measurement method and device thereof.

BACKGROUND

Synchronized phasor (synchrophasor) measurement unit (PMU) has become an important measurement component in a power system and can provide high precision voltage and current phasors and frequency which are synchronized with an absolute time reference. The applications of PMU have been well recognized for real time dynamic monitoring, operation and control of the power system.

Traditionally, a power system may be monitored through a combination of non-synchronized measurements, for example, generator/load power and voltage magnitudes are fed into a software model, and then the complete voltage angle and magnitude information for each bus for specified load and generator real power and voltage conditions are calculated. However, these quantities can be calculated directly using PMU.

With the growing demand for synchrophasor measurement technology, a standard related to this measurement has been set up by IEEE to ensure the interoperability of devices from different vendors since 2005. There are now many PMUs in compliance with the standard in the market. However, as the standard is only designed for steady-state measurement and cannot meet further demand for dynamic-state measurement (such as during power swing, phase angle change, frequency consecutive change and even fault disturbance) with a lack of comparability and interoperability among synchrophasors measured by different products, some vendors have begun to use their enterprise standard defined by themselves. Based on the new demand, the IEEE and IEC have been working together to establish a new standard including dynamic-state measurement. This standard may be released soon.

A synchrophasor measurement method and device applicable to both the steady-state measurement and dynamic-state measurement in a power system is thus needed. Such a method and device is able to comply with the new standard that covers the dynamic-state measurement in the power system.

SUMMARY

In consideration of the above issues, the present invention is proposed. It aims at providing a high precision synchrophasor measurement method and device, which obtains synchronized voltage phasor and synchronized current phasor by removing the out-of-band interference from raw samples of voltage and current signals, then a first resampling to obtain an estimated system frequency followed by a second resampling for each reporting time. The synchrophasor measurement method selects different calculation window length for steady operation and dynamic operation of the power system respectively, and calculates the estimated system frequency for each sample, thus high-precision may still be achieved while the method is applied to the dynamic operating condition and the requirements of the new standard may be met.

According to one aspect of the present invention, it is provided a synchrophasor measurement method, comprising: sampling voltage and current signals in a power system based on an absolute time reference; removing out-of-band interference in the sampled voltage and current signals; first-resampling at least one of the voltage and current signals with the out-of-band reference being removed based on an estimated system frequency; calculating phasor for signals obtained from the first resampling, and updating the estimated system frequency; for a reporting time, second-resampling the voltage and current signals with the out-of-band reference being removed based on the updated estimated system frequency; and calculating synchrophasor for the voltage and current signals obtained from the second resampling.

Preferably, in the synchrophasor measurement method, the out-of-band interference in the sampled voltage and current signals is removed with a bandpass filter which is customized according to performance class, nominal system frequency of the power system and reporting rate.

Preferably, in the synchrophasor measurement method, calculating phasor for signals obtained from the first resampling comprises: determining the length of a first calculation window according to an operation status of the power system; and calculating phasor for signals obtained from the first resampling in the first calculation window.

Preferably, in the synchrophasor measurement method, updating the estimated system frequency comprises: for each sample obtained from the first resampling, calculating the estimated system frequency; smooth filtering the calculated estimated system frequency to update the estimated system frequency; and setting a corresponding time tag for the updated estimated system frequency, said the time tag compensating the delay introduced by the out-of-band interference removing and the delay introduced by the smooth filtering.

Preferably, in the synchrophasor measurement method, second-resampling the voltage and current signals with the out-of-band reference being removed comprises: estimating the system frequency at a reporting time based on the updated estimated system frequency and its corresponding time tag; and seond-resampling the voltage and current signals with the out-of-band interference being removed based on the estimated system frequency at the reporting time, which comprises: determining the center of a second calculation window based on the reporting time; determining the length of the second calculation window based on a reporting rate, and second-resampling the voltage and current signals with the out-of-band interference being removed based on the estimated system frequency at the reporting time in the second calculation window.

Preferably, the synchrophasor measurement method further comprises calculating rate of change of system frequency by using curve fitting based on the updated estimated system frequency.

According to another aspect of the present invention, it is provided a synchrophasor measurement device, comprising: a raw sampler, for sampling voltage and current signals in a power system based on an absolute time reference; a filter, for removing out-of-band interference in the sampled voltage and current signals; a first resampler, for first-resampling at least one of the voltage and current signals with the out-of-band reference being removed based on an estimated system frequency; a system frequency estimation means, for calculating phasor for signals obtained from the first resampling, and updating the estimated system frequency; a second resampler, for second-resampling the voltage and current signals with the out-of-band reference being removed based on the updated estimated system frequency for a reporting time; and a synchrophasor estimation means, for calculating synchrophasor for the voltage and current signals obtained from the second resampling.

Preferably, said filter is a bandpass filter being customized according to performance class, nominal system frequency of the power system and reporting rate.

Preferably, the system frequency estimation means determines the length of a first calculation window according to an operation status of the power system, and calculates phasor for signals obtained from the first resampling in the first calculation window.

Preferably, the system frequency estimation means calculates the estimated system frequency for each sample obtained from the first resampling, smooth filters the calculated estimated system frequency to update the estimated system frequency, and sets a corresponding time tag for the updated estimated system frequency, said time tag compensating the delay introduced by the out-of-band interference removing and the delay introduced by the smooth filtering.

Preferably, the second resampler estimates the system frequency at a reporting time based on the updated estimated system frequency and its corresponding time tag, determines the center of a second calculation window based on the reporting time, determines the length of the second calculation window based on a reporting rate, and secondly resamples the voltage and current signals with the out-of-band interference being removed based on the estimated system frequency at the reporting time in the second calculation window.

According to still another aspect of the present invention, it is provided a system frequency measurement method of a power system, comprising: sampling voltage and current signals in a power system based on an absolute time reference; removing out-of-band interference in the sampled voltage and current signals; first-resampling at least one of the voltage and current signals with the out-of-band reference being removed based on an estimated system frequency; and calculating phasor for signals obtained from the first resampling, and updating the estimated system frequency.

Preferably, in the system frequency measurement method, calculating phasor for signals obtained from the first resampling comprises: determining the length of a first calculation window according to an operation status of the power system; and calculating phasor for signals obtained from the first resampling in the first calculation window.

Preferably, in the system frequency measurement method, updating the estimated system frequency comprises: for each sample obtained from the first resampling, calculating the estimated system frequency; smooth filtering the calculated estimated system frequency to update the estimated system frequency; and setting a corresponding time tag for the updated estimated system frequency, said time tag compensating the delay introduced by the out-of-band interference removing and the delay introduced by the smooth filtering.

Preferably, the system frequency measurement method further comprises: for a reporting time, estimating the system frequency at the reporting time based on the updated estimated system frequency and its corresponding time tag; second-resampling the voltage and current signals with the out-of-band reference being removed based on the estimated system frequency at the reporting time; and calculating synchrophasor for the voltage and current signals obtained from the second resampling.

Preferably, in the system frequency measurement method, second resampling the voltage and current signals with the out-of-band interference being removed comprises: determining the center of a second calculation window based on the reporting time; determining the length of the second calculation window based on a reporting rate, and second-resampling the voltage and current signals with the out-of-band interference being removed based on the estimated system frequency at the reporting time in the second calculation window, wherein, calculating synchrophasor for voltage and current signals obtained from the second resampling comprises: calculating synchrophasor for the voltage and current signals obtained from the second resampling in the second calculation window.

Preferably, the system frequency measurement method further comprises: calculating rate of change of system frequency by using curve fitting based on the updated estimated system frequency.

With the synchrophasor measurement method and device according to the present invention, the raw samples of voltage and current signals are first filtered to remove the out-of-band interference, then a specific calculation window length is selected for each sample in the first resampling according to the operation status of the power system to obtain the estimated system frequency, and the synchronized voltage phasor and synchronized current phasor at the reporting time are obtained with the second resampling, thus it is guaranteed to be not only applicable to the steady state of the power system but also the dynamic state thereof, and at the same time, high-precision synchrophasor measurement result is provided.

BRIEF DESCRIPTION OF THE DRAWINGS

The above and other purposes, characteristics and advantages of the present invention will become more apparent to those skilled in the art with the detailed description to the embodiments of the present invention by referring to the accompanying drawings, in which.

DETAILED DESCRIPTION

Figure 1:
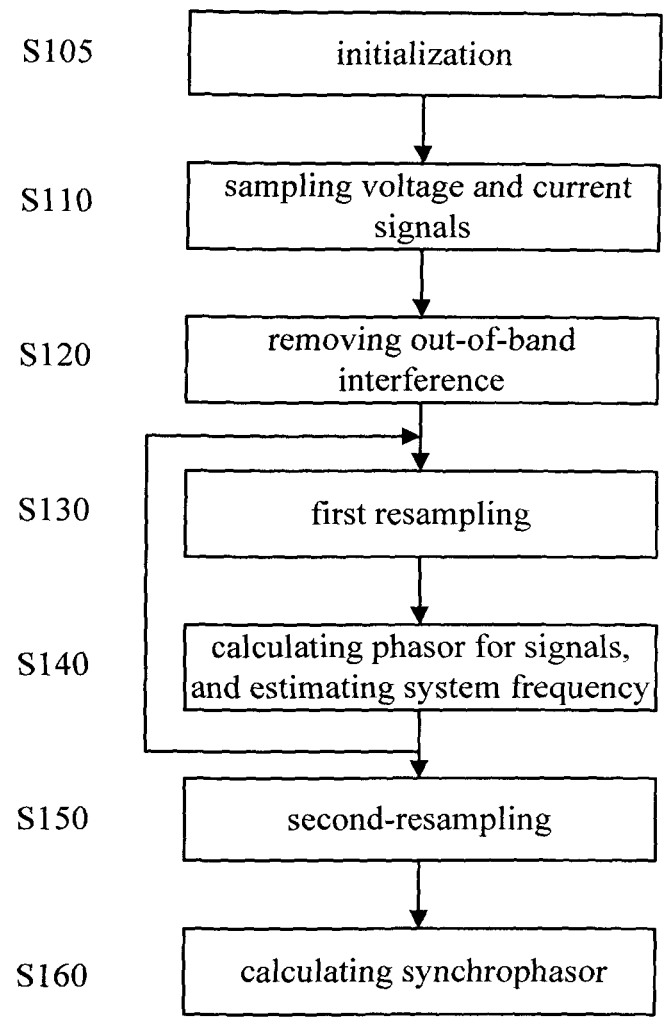
FIG. 1 is a flow chart of the synchrophasor measurement method according to an embodiment of the present invention.

A synchrophasor measurement method and device according to embodiments of the present invention will now be described by referring to the accompanying figures.

First, a synchrophasor measurement method according to an embodiment of the present invention will be described by referring to FIG. 1.

At Step S105, the synchrophasor measurement method 100 according to the embodiment of the present invention is initialized.

At Step S110, voltage and current signals in a power system are sampled based on an absolute time reference. As known in the art, the voltage and current signals in the power system are sampled in a synchronized sampling system using an A/D converter so as to obtain raw samples of the voltage and current signals. Typically, the triggering sampling pulse used in the synchronized sampling system is locked in phase with an absolute time reference, such as the 1PPS signal of GPS or other absolute time reference from other sources. For example, the triggering sampling pulse used in the synchronized sampling system may be a divided signal of the 1PPS signal of GPS; or a pulse signal generated from local oscillators, and in this case, the local oscillator is synchronized with the absolute time reference at every predetermined interval (for example, 1 s).

Then at Step S120, the out-of-band interference is removed from the raw samples of the voltage and current signals. The out-of-band interference signal is a signal at frequency f where: $|f-f_0| \geq Fs/2$, wherein $f_0$ is the nominal system frequency of the power system; and Fs is the reporting rate of PMU (synchronized phasor measurement unit), i.e. the reporting times per second. For example, the reporting rate of PMU may be 10 Hz, 20 Hz, 60 Hz, 120 Hz and so on. Taking an example of 10 Hz as the reporting rate, then the reporting times per second is 10 times with the corresponding reporting time being at 0.1 s, 0.2 s, 0.3 s, ... 0.9 s, 1 s. More generally, when the reporting interval is labeled as $T_0$, the reporting time may be indicated correspondingly as $T_0$, $2T_0$, $3T_0$, ..., $kT_0$, $(k+1)T_0$, ..., $NT_0$.

At Step S130, based on an estimated system frequency, a first resampling is performed on at least one of the voltage and current signals with the out-of-band reference being removed. After the initialization of the system, the estimated system frequency is firstly set to the nominal system frequency of the power system.

Then, at Step S140, phasor is calculated for signals obtained from the first resampling, and the estimated system frequency is updated.

Next, the synchrophasor measurement method 100 according to the embodiment of the present invention returns to Step S130, and performs the first resampling with the estimated system frequency updated at Step S140.

On the other hand, after Step S140, the synchrophasor measurement method 100 according to the embodiment of the present invention advances to Step S150, wherein for each reporting time, the voltage and current signals with the out-of-band reference being removed are second-resampled based on the updated estimated system frequency. For example, at Step S150, for each reporting time, the system frequency at the reporting time is first estimated based on the updated estimated system frequency, then the voltage and current signals with the out-of-band reference being removed are second-resampled based on the estimated system frequency at the reporting time.

At last, at Step S160, synchrophasor is calculated for the voltage and current signals obtained from the second resampling.

Next, exemplary operation of Step S120 for removing the out-of-band reference signal in the synchrophasor measurement method 100 according to the embodiment of the present invention will be briefly illustrated by referring to FIGS. 2 and 3. It should be understood that the operation of Step S120 for removing the out-of-band reference signal in the synchrophasor measurement method 100 according to the embodiment of the present invention is not limited to the examples described as follows, and a person skilled in the art may design different filters upon actual requirements.

As described above, the out-of-band interference signal is a signal at frequency f where: $|f-f_0| \geq Fs/2$, wherein $f_0$ is the nominal system frequency of the power system; and Fs is the reporting rate of PMU, i.e. the reporting times per second.

The filters may be designed with considerations to specified sampling rate, reporting rate, nominal system frequency of the power system and performance class. Regarding the performance class, there are typically two different kinds in the synchrophasor measurement, namely a first performance class (M class) intended for high precision synchrophasor measurement, and a second performance class (P class) intended for fast response synchrophasor measurement. The M class filter requires a higher measurement precision and is more tolerant of reporting latency, while the P class filter requires a faster response (i.e. a shorter reporting latency) and lower measurement precision.

Figure 2A:
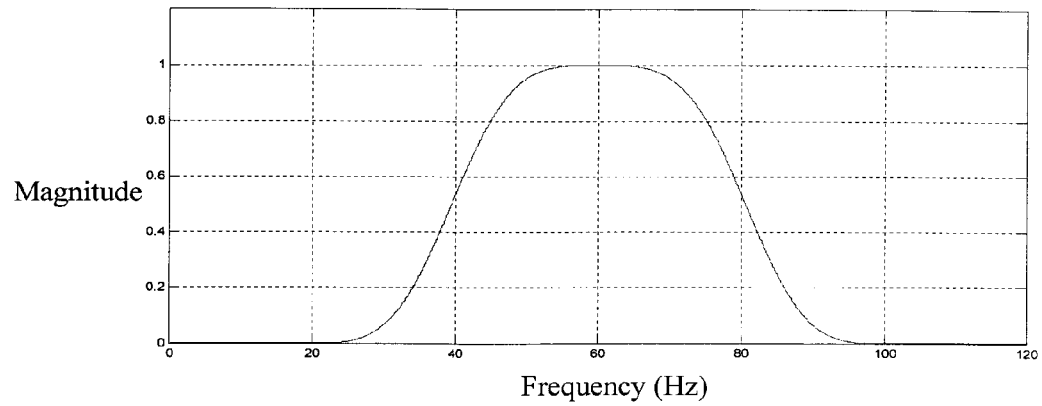
FIGS. 2A and 2B are examples of a band pass filter designed for a first performance class (M class)

For example, for a M class filter, when the sampling rate is 4800 Hz, the reporting rate is 60 Hz and the nominal system frequency is 60 Hz, a finite impulse response (FIR) filter with the amplitude-frequency response curve as shown in FIG. 2A may be used.

Figure 2B:
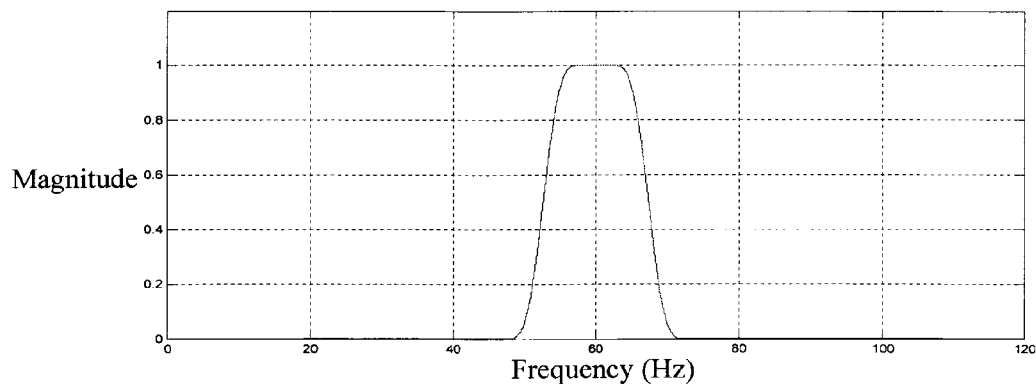

As an alternative example, for a M class filter, when the sampling rate is 4800 Hz, the reporting rate is 20 Hz and the nominal system frequency is 60 Hz, a FIR filter with the amplitude-frequency response curve as shown in FIG. 2B may be used.

As it is considered that P class is intended for applications requiring fast response and allowing short reporting latency. Therefore, there is no requirement for P class to remove all out-of-band interference.

Figure 3B:
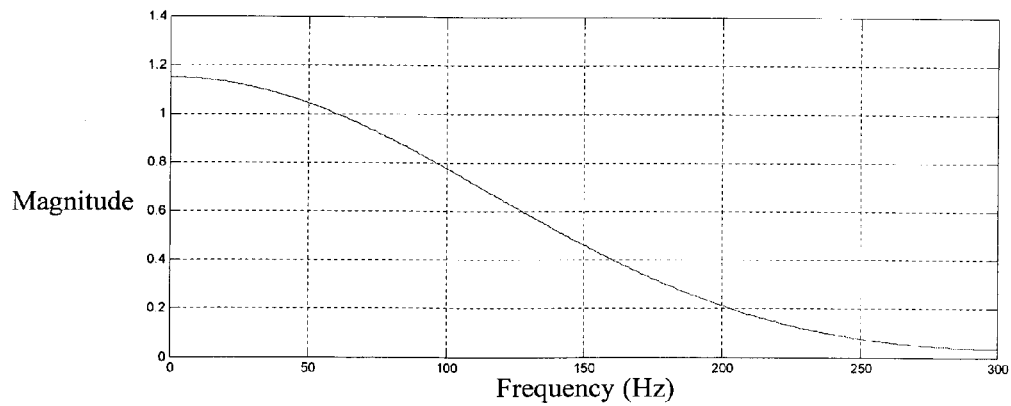
FIGS. 3A and 3B are examples of a band pass filter designed for a second performance class (P class)
Figure 3A:
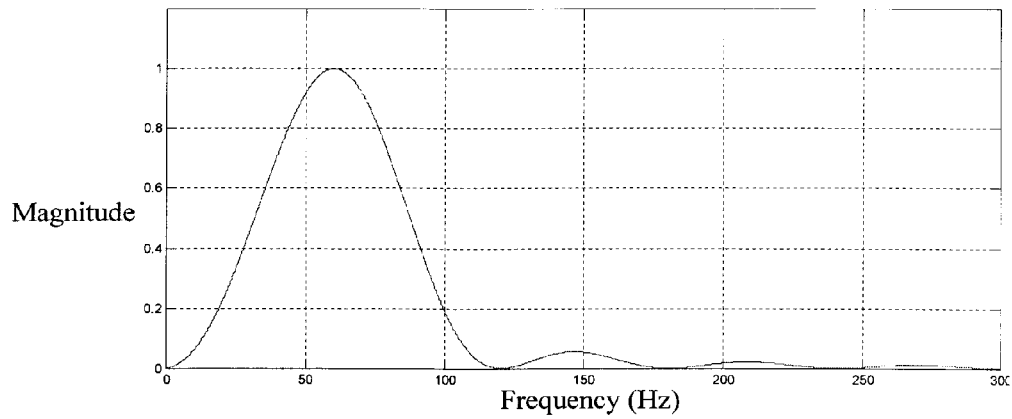

For example, for a P class filter, when the sampling rate is 4800 Hz, the reporting rate is 60 Hz and the nominal system frequency is 60 Hz, a filter with the amplitude-frequency response curve as shown in FIG. 3A may be used and it meets the requirement of P class application for very small reporting latency. Compared with the amplitude-frequency response curve of FIG. 2A, a shorter reporting latency is obtained in the curve of FIG. 3A at the cost of the flatness of the curve of FIG. 3A being dramatically reduced. In the case where the reporting rate is less than 60 Hz, a filter with an amplitude-frequency response similar to that of FIG. 3A may also be used.

As an alternative example, for a P class filter, when the sampling rate is 4800 Hz, the reporting rate is 120 Hz and the nominal system frequency is 60 Hz, a filter with the amplitude-frequency response curve as shown in FIG. 3B may be used and it meets the requirement of P class application for very small reporting latency. FIG. 3B shows an extreme case of the bandpass filter i.e. a low-pass filter. Furthermore, in the case where the reporting rate is larger than 60 Hz, a filter with an amplitude-frequency response similar to that of FIG. 3B may also be used.

After the filter having been designed, the filtered signals may be obtained as follows:

$$x(k) = \sum_{m=0}^{L-1} y(k-m) \cdot h(m) \quad (1)$$

$$= \sum_{m=0}^{\frac{L-1}{2}-1} [y(k-m) + y(k-L+1-m)] \cdot$$

$$h(m) + y\left(k - \frac{L-1}{2}\right) \cdot h\left(\frac{L-1}{2}\right)$$

Wherein x(•) is the filtered voltage and current signals; h(•) is the coefficients of the filter; y(•) is raw samples of the voltage and current signals; and L is the number of samples used in the filter.

Next, the exemplary operation of Step S140 of the synchrophasor measurement method 100 according to an embodiment of the present invention will be described. It should be understood that the operation of Step S140 of the synchrophasor measurement method 100 according to the embodiment of the present invention is not limited to the examples described as follows, and a person skilled in the art may design different calculation window.

At Step S140, different window length is selected based on the operating state of the power system, i.e. whether the power system is in a steady state or a dynamic state. For example, if the power system is in a steady state, then one cycle window length may be selected for either M class or P class; while if the power system is in a dynamic state, then ½ or ¼ cycle or other proper value may be selected for use as the window length.

For the steady state, the one-phase voltage phasor is calculated by using the following formula with a current voltage obtained from the first resampling and N previous voltages obtained from the first resampling:

$$\dot{X}(i) = \frac{\sqrt{2}}{N} \sum_{k=0}^{N-1} x(i - N + k) \cdot e^{-j\frac{2\pi}{N}\left(i+k-\frac{1}{2}\right)} \quad (2)$$

Wherein $\dot{X}(i)$ is the current voltage phasor of one-phase, N is the number of samples in one cycle and i is the index number of the current voltage obtained from the first resampling.

Similarly, the current obtained from the first resampling and N previous currents obtained from the first resampling may be used to calculate the phasor of the one-phase-current, by using formula (2).

For the dynamic state, when the calculation window length is selected to be ½ cycle, the one-phase voltage phasor may be calculated by using the following formula with the current voltage obtained from the first resampling and (N/2) previous voltage samples obtained from the first resampling:

$$\dot{X}(i) = \frac{2\sqrt{2}}{N} \sum_{k=0}^{N/2-1} x(i - N/2 + k) \cdot e^{-j\frac{2\pi}{N}\left(i+k-\frac{1}{2}\right)} \quad (3)$$

Similarly, the current obtained from the first resampling and (N/2) previous current samples obtained from the first resampling may be used to calculate the phasor of the one-phase-current, by using formula (3).

For the dynamic state, when the calculation window length is selected to be ¼ cycle, the one-phase voltage phasor is calculated by using the following formula with the current voltage obtained from the first resampling and (N/4) previous voltage samples obtained from the first resampling and N being equal to 80, i.e. 80 samples per cycle:

$$\begin{bmatrix} X_R(i) \\ X_I(i) \end{bmatrix} = \begin{bmatrix} 0.1684 & 0.1073 \\ 0.1073 & 0.1684 \end{bmatrix} \cdot \begin{bmatrix} \sum_{k=i-N/4+1}^{i} \cos\left(\frac{2\pi}{N} \cdot \left(k - \frac{1}{2}\right)\right) \cdot x(k) \\ \sum_{k=i-N/4+1}^{i} \cos\left(\frac{2\pi}{N} \cdot \left(k - \frac{1}{2}\right)\right) \cdot x(k) \end{bmatrix} \quad (4)$$

Wherein $X_R(i)$ is the real part of the one-phase current voltage and $X_I(i)$ is the imaginary part of the one-phase current voltage.

Similarly, the current obtained from the first resampling and (N/4) previous current samples obtained from the first resampling may be used to calculate the phasor of the one-phase-current, by using formula (4).

It should be understood that the above formulas (2), (3) and (4) are examples only and the present invention are not limited thereto, and alternatively formulas (2), (3) and (4) may be achieved with recursion.

Figure 4:
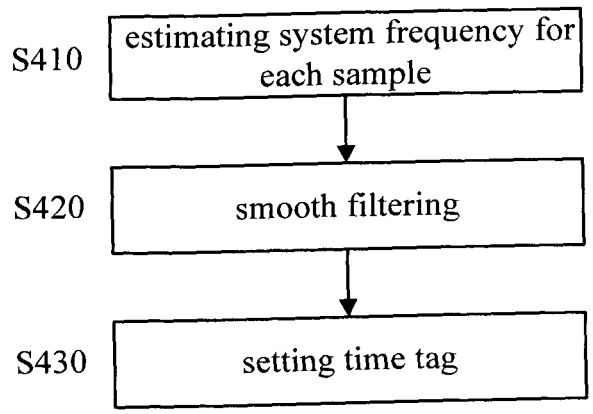
FIG. 4 is a detailed flow chart of the step for updating the estimated system frequency according to an embodiment of the present invention.

Next, it will be described as how to update the estimated system frequency with the calculated phasor resulted from the above formulas by referring to FIG. 4.

At Step S140, for each sample obtained from the first resampling, the estimated system frequency is calculated. For example, the estimated system frequency is updated according to the angle difference between the current estimated phasor and the previous phasor being spaced a predetermined time interval from the current instant.

For example, after an one-phase voltage phasor (i.e. un-synchronized voltage phasor) is obtained, the positive sequence voltage phasor is given by:

$$\dot{V}_1(i) = \frac{1}{3}(\dot{V}_A(i) + \alpha \dot{V}_B(i) + \alpha^2 \dot{V}_C(i)) \quad (5)$$

Wherein $\dot{V}_A(i) = V_{AR}(i) + jV_{AI}(i)$
$\dot{V}_B(i) = V_{BR}(i) + jV_{BI}(i)$
$\dot{V}_C(i) = V_{CR}(i) + jV_{CI}(i)$
$\alpha = e^{j2\pi/3}$ Wherein $\dot{V}_A(i)$ is the A-phase voltage phasor, $V_{AR}(i)$ is the real part of the A-phase voltage phasor, $V_{AI}(i)$ is the imaginary part of the A-phase voltage phasor; $\dot{V}_B(i)$ is the B-phase voltage phasor, $V_{BR}(i)$ is the real part of the B-phase voltage phasor, $V_{BI}(i)$ is the imaginary part of the B-phase voltage phasor; $\dot{V}_C(i)$ is the C-phase voltage phasor, $V_{CR}(i)$ is the real part of the C-phase voltage phasor, $V_{CI}(i)$ is the imaginary part of the C-phase voltage phasor.

Similarly, after an one-phase current phasor is obtained, the positive sequence current phasor may be calculated by using formula (5).

After the current positive sequence voltage phasor for each sample obtained from the first resampling is calculated, the estimated system frequency is calculated by using formula (6) according to the angle difference between the positive sequence voltage phasor at the current sample time and the positive sequence voltage phasor at a sample time that is spaced the calculation window length from the current sample time.

$$f_k = f_{k-1} + f_{k-1} \frac{\Delta \phi_k}{2\pi} \cdot \frac{N}{m} \quad (6)$$

Wherein $f_k$ is the estimated system frequency at the current time (k), $f_{k-1}$ is the estimated system frequency at the previous time (k−1) before the current time (k), $\Delta\phi_k=\phi_k-\phi_{k-m}$ is the angle difference of the positive sequence voltage phasor of the current time (k) and the positive sequence voltage phasor of the time (k−m) that is spaced calculation window of m from the current time, m is the calculation window length represented by the number of samples, i.e. the number of samples in the calculation window, for example taking N (one cycle)=80, for the case where the calculation window is selected to be one cycle, m=80; for the case where the calculation window is selected to be ½ cycle, m=40; and for the case where the calculation window is selected to be ¼ cycle, m=20. However, the present invention is not limited thereto and the length of the calculation window may be selected according to the requirements and the corresponding m may be obtained.

$\Delta\phi_k$ may be calculated by using the following formula:

$$\Delta\phi_k = \begin{cases} a\tan\left(\dfrac{\sin(\Delta\phi_k)}{\cos(\Delta\phi_k)}\right) & \text{if } \sin(\Delta\phi_k) > 10\cos(\Delta\phi_k) \\ \dfrac{\pi}{2}\text{sign}(\sin(\Delta\phi_k)) & \text{else} \end{cases} \quad (7)$$

$$\sin(\Delta\phi_k) = \text{Im}(\dot{V}_1(k))\cdot\text{Re}(\dot{V}_1(k-m)) - \text{Re}(\dot{V}_1(k))\cdot\text{Im}(\dot{V}_1(k-m))$$

$$\cos(\Delta\phi_k) = \text{Im}(\dot{V}_1(k))\cdot\text{Im}(\dot{V}_1(k-m)) + \text{Re}(\dot{V}_1(k))\cdot\text{Re}(\dot{V}_1(k-m))$$

Wherein Im(•) represents the imaginary part of "•", and Re(•) represents the real part of "•".

Similarly, the estimated system frequency may be calculated by using formulas (6) and (7) according to the angle difference of the positive sequence voltage phasor of the current time and that of the time spaced the calculation window length from the current time.

However, the present invention is not limited thereto, a person skilled in the art may also use other method to calculate estimated system frequency as the updated estimated system frequency where the positive sequence voltage phasor or the positive sequence current phasor is not calculated.

More advantageously, at Step S420, the estimated system frequency is updated by performing smooth filtering on the calculated estimated system frequency $f_k$. For example, the smooth filtering may be performed with the estimated system frequency $f_k$ at the current time (k) and previous m estimated system frequencies by using the following formula:

$$f'_k = \dfrac{\sum_{i=k-m}^{k} f_i}{m} \quad (8)$$

Wherein $f'_k$ is the estimated system frequency after the smooth filtering, and is used as the updated estimated system frequency.

However, the smooth filtering is not limited to the case expressed in formula (8), a person skilled in the art may perform smooth filtering upon actual requirements with the weighted average.

Furthermore, the smooth filtering may not be necessary, in other words, the estimated system frequency calculated with formula (6) may be used directly as the updated estimated system frequency.

Then at Step S430, after the updated estimated system frequency (formula (6)) is obtained, a time tag corresponding to the system frequency is calculated, wherein the time tag compensates the delay introduced by the out-of-band interference removing. Furthermore, in the case where the smooth filtering is performed (the case of formula (8)), the time tag also compensates the delay introduced by the smooth filtering.

$$t=t_{res}-t_{fd}-t_{ad} \quad (9)$$

Wherein t is the time tag of the updated estimated system frequency, $t_{res}$ is the time in the raw samples of voltage/current signal corresponding to the sample obtained at the current time k from the first resampling, $t_{fd}$ is the delay introduced by the out-of-band interference removing, and $t_{ad}$ is the delay introduced by the smooth filtering.

In addition, after the updated estimated system frequency is obtained (formula (6) or (8)), the new sample interval (i.e. the interval between the current time and the next sampling time) can be calculated by the following formula:

$$\Delta t = \dfrac{1}{N\cdot f'_k}$$

Next, an exemplary operation of the Step S150 of the synchrophasor measurement method 100 according to the embodiment of the present invention will be described by referring to FIG. 5, wherein for a specific reporting time, the system frequency at the specific reporting time is estimated based on the updated estimated system frequency at Step S140, then the voltage and current signals with the out-of-band interference being removed is second-resampled. It should be understood that the operation of the phasor calculation Step S150 in the synchrophasor measurement method 100 according to the embodiment of the present invention is not limited to the examples described as follows, a person skilled in the art may design different calculation windows upon actual requirements.

As each reporting time does not necessarily correspond to the time tag of the updated estimated system frequency after the first resampling, the system frequency of each reporting time should be estimated based on the updated estimated system frequency and its corresponding time tag.

First at Step S510, the system frequency at the reporting time is estimated based on the updated estimated system frequency and its corresponding time tag.

For example, the system frequency at the reporting time can be obtained by the following two steps: obtaining two estimated system frequencies with the time tag being closest to the reporting time, and interpolating between the two estimated system frequencies based on the time tags of the two estimated system frequencies. The system frequency of at the reporting time can be estimated by using the following formula:

$$f_{out} = f'_m + \dfrac{f'_{m+1} - f'_m}{t_{m+1} - t_m}\cdot(t_c - t_m) \quad (11)$$

Wherein $t_c$ is the reporting time, $f_{out}$ is the system frequency at reporting time, $t_m$ is the closest time tag before the reporting time, $t_{m+1}$ is the closest time tag after the reporting time, $f'_m$ is the estimated system frequency with the time tag $t_m$, and $f'_{m+1}$ is the estimated system frequency with the time tag $t_{m+1}$.

Next, in Steps S520-S540, the voltage and current signals with the out-of-band interference being removed are second-resampled.

Specifically, at Step S520, the center of a second calculation window is determined based on the reporting time. For example, the reporting time may be the center of the second calculation window.

At Step S530, the length of the second calculation window may be determined based on the reporting rate. For example, when the reporting rate is 60 Hz, the length of the second calculation window may be selected as one cycle, i.e. having N samples. However, the present invention is not limited thereto, and with a higher reporting rate such as 120 Hz, the length of the second calculation window may be selected as ½ cycle, i.e. having N/2 samples.

Then at Step S540, in the second calculation window, the voltage and current signals with the out-of-band interference being removed are second-resampled based on the estimated system frequency at the reporting time.

For example, the sample interval of the second resampling can be calculated with the estimated system frequency at the reporting time by using the following formula:

$$\Delta t_{out} = \frac{1}{N \cdot f_{out}} \quad (12)$$

Wherein N is the number of samples in one cycle.

Therefore, in the case where the reporting time is the center of the second calculation window, the corresponding time in the raw samples of voltage and current signals for each sample in the second calculation window can be calculated as follows:

$$t_{pi} = t_c + t_{fd} - t_{wid} + \frac{1}{2} i \cdot \Delta t$$

Wherein $t_{pi}$ is the corresponding time in the raw samples of voltage and current signals for the $i^{th}$ (1≤i≤N) sample in the second calculation window; $t_c$ is the center of the second calculation window i.e. the reporting time of the current calculation; $t_{fd}$ is the delay introduced by the out-of-band removing; and $t_{wid}$ is the half-window delay, i.e. half of the total time length of the second calculation window.

Figure 5:
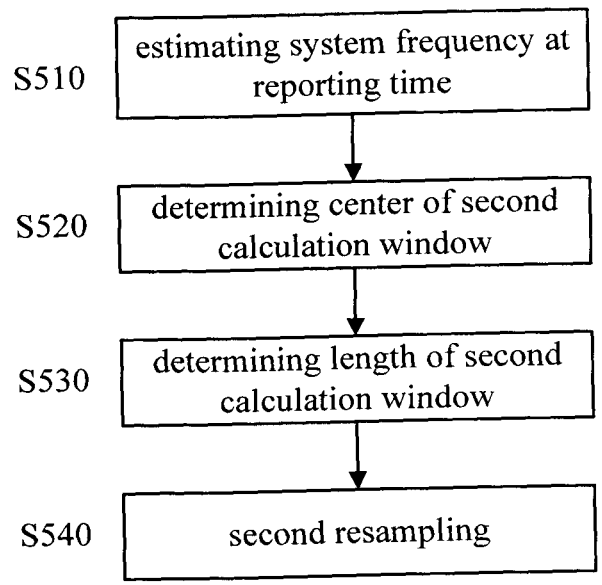
FIG. 5 is a detailed flow chart of the step for second-resampling and synchrophasor calculating according to an embodiment of the present invention.

At last, after all the steps in FIG. 5 are performed, the synchrophasor measurement method according to the embodiment of the present invention advances to Step S160 as shown in FIG. 1, wherein in the second calculation window, a synchrophasor is calculated for the voltage and current signals obtained from the second resampling.

In the second calculation window, a synchrophasor is calculated for the voltage and current signals obtained from the second resampling, so as to be used as the reporting synchrophasor at the reporting time corresponding to the second calculation window. When the calculation window is one cycle, the calculation formula is given by:

$$\dot{X}_{out}(i) = \frac{\sqrt{2}}{N} \sum_{k=-N/2}^{N/2-1} x\left(i+k+\frac{1}{2}\right) \cdot e^{-j\left(\frac{2\pi}{N}\left(i+k+\frac{N}{2}\right)-\pi+\frac{\pi}{N}\right)} \quad (13)$$

Wherein $\dot{X}_{out}$ (i) is the one-phase current voltage or current, N is the number of samples in one cycle, k is the index number of the current voltage or current obtained from the second resampling and i corresponds to the index number of reporting time.

Furthermore, a high-precision rate of change of frequency (ROCOF) may be obtained after Step S140 wherein the estimated system frequency is updated by the synchrophasor measurement method according to the embodiments of the present invention, wherein the updated estimated system frequency may be the calculation result from formula (8). In order to obtain high-precision, a curve fitting within a predetermined period may be used and the predetermined period may be selected as two continuous cycles. However, the present invention is not limited thereto, and the predetermined period may be selected as other length upon actual system design requirements.

$$f = k_f t + f_{ini} \quad (14)$$

Wherein $k_f$ is the slope of the curve fitting i.e. ROCOF; t is the specific time within the predetermined period, f is the estimated system frequency corresponding to the specific time within the predetermined period; and $f_{ini}$ is a constant.

Furthermore, because the foregoing amplitude-frequency response cannot be completely flat, especially for filters of class P (as can be seen from FIGS. 3A and 3B), it is necessary to compensate the calculated phasor's amplitude in order to achieve high precision. Accordingly, the amplitude deviation due to filtering can be compensated after Step S160 where the synchrophasor is calculated for the voltage and current signals obtained from the second resampling by the synchrophasor measurement method according to the embodiments of the present invention. For example, such amplitude deviation may result from the unflatness of the passband and most of the edge of a bandpass filter.

Ideally, all designed filter's amplitude response can be pre-calculated off-line and saved in a buffer according to piecewise-defined frequency. Therefore, the amplitude deviation due to unflatness of the passband and most of the edge of a bandpass filter can be calculated using the following formula:

$$\dot{X}'_{out}(f_{out}) = \dot{X}_{out}(f_{out}) \cdot h(f_{out}) \quad (15)$$

Where $\dot{X}_{out}(f_{out})$ is the sychrophasor at frequency $f_{out}$ that is calculated at the reporting time; $\dot{X}'_{out}(f_{out})$ is the synchrophasor at the frequency $f_{out}$ after compensation; and $h(f_{out})$ is the reciprocal of amplitude coefficient of the designed filter at the frequency $f_{out}$.

Figure 6:
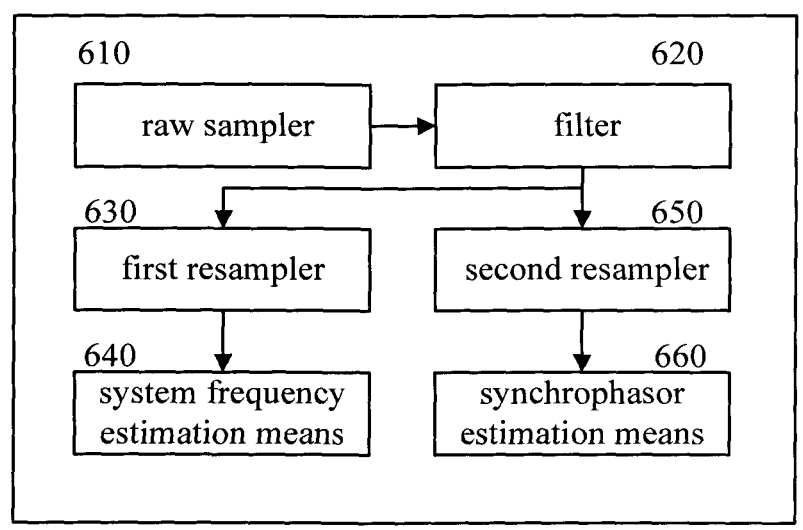
FIG. 6 is a schematic block diagram of a synchrophasor measurement device according to an embodiment of the present invention.

Next, a synchrophasor measurement device 600 according to an embodiment of the present invention will be briefly described by referring to FIG. 6.

The synchrophasor measurement device 600 comprises a raw sampler 610, a filter 620, a first resampler 630, a system frequency estimation means 640, a second resampler 650 and a synchrophasor estimation means 660.

The raw sampler 610 samples the voltage and current signals of the power system based on an absolute time reference.

The filter 620 filters the out-of-band interference of the sampled voltage and current signals. As described above, the filter 620 may be customized according to performance class, nominal system frequency of the power system and reporting rate, and the filter 620 may be a bandpass filter.

The first resampler 630 first-resamples at least one of the voltage and current signals with the out-of-band interference being removed.

The system frequency estimation means 640 calculates phasor for signals obtained from the first resampling and updates the estimated system frequency.

Preferably, the system frequency estimation means 640 determines the length of the calculation window according to the operation status of the power system, calculates phasor for signals obtained from the first resampling in the calculation window, and updates the estimated system frequency according to the calculated phasor.

Preferably, the system frequency estimation means 640 calculates the estimated system frequency for each sample obtained from the first resampling in order to update the estimated system frequency, and sets corresponding time tag for the updated estimated system frequency, the time tag compensating the delay introduced by filtering the out-of-band interference.

More preferably, after the system frequency estimation means 640 calculates the estimated system frequency for each sample obtained from the first resampling, it also performs smooth filtering on the calculated estimated system frequency so as to update the estimated system frequency. In this case, the corresponding time tag set for the updated estimated system frequency also compensates the delay introduced by the smooth filtering.

The second resampler 650 second-resamples the voltage and current signals with the out-of-band interference being removed based on the updated estimated system frequency for a reporting time.

Preferably, the second resampler 650 estimates the system frequency at the reporting time based on updated estimated system frequency and its corresponding time tag, determines the center of the second calculation window based on the reporting time, determines the length of the second calculation window based on the reporting rate, and in the second calculation window second-resamples the voltage and current signals with the out-of-band interference being removed based on the estimated system frequency at the reporting time.

The synchrophasor estimation means 660 calculates the synchrophasor for the voltage and current signals obtained from the second resampling.

The raw sampler 610, the first resampler 630 and the second resampler 650 can be implemented individually in hardware samplers, or the raw sampler 610 may be implemented in a hardware A/D sampler, while the first resampler 630 and the second resampler 650 may be implemented in special purposed processor, general purposed processor or FGPA etc.

The filter 620 may be implemented in special purposed filter circuits, or in special purposed processor, general purposed processor or FGPA etc.

The system frequency estimation means 640 and the synchrophasor estimation means 660 may be implemented individually in separate special purposed processors, or may be implemented on the same general purposed processor or FGPA etc.

With the synchrophasor measurement method and device according to the present invention, the raw samples of voltage and current signals are first filtered to remove the out-of-band interference, then specific calculation window length is selected for each sample in the first resampling according to the operation status of the power system to obtain the estimated system frequency, and the synchronized voltage phasor and synchronized current phasor at the reporting time are obtained with the second resampling, thus it is guaranteed to be not only applicable to the steady state of the power system but also the dynamic state thereof, and at the same time, high-precision synchrophasor measurement result is provided.

While exemplary embodiments have been described by referring to the accompanying drawings herein, it should be understood that the above exemplary embodiments are illustrative only and are not intended to limit the scope of the present invention thereto. An ordinary person skilled in the art may make various modifications and alterations without departing from the scope and spirit of the present invention. It is intended that all these modifications and alterations be encompassed within the appended claims.

What is claimed is:

1. A synchrophasor measurement method, for a power system for real time dynamic monitoring, operation and control of the power system, comprising:
   sampling voltage and current signals in a power system based on an absolute time reference;
   removing out-of-band interference in the sampled voltage and current signals;
   first-resampling at least one of the voltage and current signals with the out-of-band interference being removed based on an estimated system frequency;
   calculating phasor for signals obtained from the first resampling, and updating the estimated system frequency;
   for a reporting time, second-resampling the voltage and current signals with the out-of-band interference being removed based on the updated estimated system frequency;
   calculating synchrophasor for the voltage and current signals obtained from the second resampling,
   wherein updating the estimated system frequency comprises:
      for each sample obtained from the first resampling, calculating the estimated system frequency;
      smooth filtering the calculated estimated system frequency to update the estimated system frequency; and
      setting a corresponding time tag for the updated estimated system frequency, the time tag compensating the delay introduced by the out-of-band interference removing and the delay introduced by the smooth filtering,
   and using the synchrophasor to execute a steady operation and a dynamic operation of the power system.

2. The synchrophasor measurement method according to claim 1, wherein,
   the out-of-band interference in the sampled voltage and current signals is removed with a bandpass filter which is customized according to performance class, nominal system frequency of the power system and reporting rate.

3. The synchrophasor measurement method according to claim 1, wherein calculating phasor for signals obtained from the first resampling comprises:
   determining the length of a first calculation window according to an operation status of the power system; and
   calculating phasor for signals obtained from the first resampling in the first calculation window.

4. The synchrophasor measurement method according to claim 1, wherein calculating the estimated system frequency for each sample obtained from the first resampling comprises:
   calculating the estimated system frequency according to the angle difference of the phasor between the sample obtained from the first resampling and a previous sample obtained from the first resampling being spaced a predetermined time length from the sample.

5. The synchrophasor measurement method according to claim 1, wherein second-resampling the voltage and current signals with the out-of-band interference being removed comprises:
 estimating the system frequency at a reporting time based on the updated estimated system frequency and its corresponding time tag; and
 second-resampling the voltage and current signals with the out-of-band interference being removed based on the estimated system frequency at the reporting time, comprising:
 determining the center of a second calculation window based on the reporting time;
 determining the length of the second calculation window based on a reporting rate, and
 second-resampling the voltage and current signals with the out-of-band interference being removed based on the estimated system frequency at the reporting time in the second calculation window,
 wherein, calculating synchrophasor for the voltage and current signals obtained from the second resampling comprises:
 calculating synchrophasor for the voltage and current signals obtained from the second resampling in the second calculation window.

6. The synchrophasor measurement method according to claim 5, wherein estimating the system frequency at the reporting time comprises:
 obtaining system frequencies estimated at two times closest to the reporting time; and
 interpolating between the system frequencies estimated at the two times closest to the reporting time, in order to calculate the system frequency at the reporting time.

7. The synchrophasor measurement method according to claim 1, further comprising:
 calculating rate of change of system frequency by using curve fitting based on the updated estimated system frequency.

8. A synchrophasor measurement device, for a power system for real time dynamic monitoring, operation and control of the power system, comprising:
 a raw sampling device, for sampling voltage and current signals in a power system based on an absolute time reference;
 a filter circuit, for removing out-of-band interference in the sampled voltage and current signals;
 a first resampling device, for first-resampling at least one of the voltage and current signals with the out-of-band interference being removed based on an estimated system frequency;
 a system frequency estimation means, for calculating phasor for signals obtained from the first resampling, and updating the estimated system frequency;
 a second resampling device, for second-resampling the voltage and current signals with the out-of-band interference being removed based on the updated estimated system frequency for a reporting time; and
 a synchrophasor estimation means, for calculating synchrophasor for the voltage and current signals obtained from the second resampling,
 wherein the system frequency estimation means calculates the estimated system frequency for each sample obtained from the first resampling, smooth filters the calculated estimated system frequency to update the estimated system frequency, and sets a corresponding time tag for the updated estimated system frequency, the time tag compensating the delay introduced by the out-of-band interference removing and the delay introduced by the smooth filtering, and
 wherein the synchrophasor measurement device uses the synchrophasor to execute a steady operation and a dynamic operation of the power system.

9. The synchrophasor measurement device according to claim 8, wherein,
 said filter circuit is a bandpass filter circuit being customized according to performance class, nominal system frequency of the power system and reporting rate.

10. The synchrophasor measurement device according to claim 8, wherein the system frequency estimation means determines the length of a first calculation window according to an operation status of the power system, and calculates phasor for signals obtained from the first resampling in the first calculation window.

11. The synchrophasor measurement device according to claim 8, wherein the second resampling device estimates the system frequency at a reporting time based on the updated estimated system frequency and its corresponding time tag, determines the center of a second calculation window based on the reporting time, determines the length of the second calculation window based on a reporting rate, and second-resamples the voltage and current signals with the out-of-band interference being removed based on the estimated system frequency at the reporting time in the second calculation window.

12. A system frequency measurement method for a power system for real time dynamic monitoring, operation and control of the power system, comprising:
 sampling voltage and current signals in a power system based on an absolute time reference;
 removing out-of-band interference in the sampled voltage and current signals;
 first-resampling at least one of the voltage and current signals with the out-of-band interference being removed based on an estimated system frequency;
 calculating phasor for signals obtained from the first resampling, and updating the estimated system frequency,
 wherein updating the estimated system frequency comprises:
 for each sample obtained from the first resampling, calculating the estimated system frequency;
 smooth filtering the calculated estimated system frequency to update the estimated system frequency; and
 setting a corresponding time tag for the updated estimated system frequency, the time tag compensating the delay introduced by the out-of-band interference removing and the delay introduced by the smooth filtering,
 and using a synchrophasor to execute a steady operation and a dynamic operation of the power system.

13. The system frequency measurement method according to claim 12, wherein calculating phasor for signals obtained from the first resampling comprises:
 determining the length of a first calculation window according to an operation status of the power system; and
 calculating phasor for signals obtained from the first resampling in the first calculation window.

14. The system frequency measurement method according to claim 12, further comprising:
 for a reporting time, estimating the system frequency at the reporting time based on the updated estimated system frequency and its corresponding time tag;

second-resampling the voltage and current signals with the out-of-band interference being removed based on the estimated system frequency at the reporting time; and calculating synchrophasor for the voltage and current signals obtained from the second resampling.

15. The system frequency measurement method according to claim 14, wherein second-resampling the voltage and current signals with the out-of-band interference being removed comprising:

determining the center of a second calculation window based on the reporting time;

determining the length of the second calculation window based on a reporting rate, and second-resampling the voltage and current signals with the out-of-band interference being removed based on the estimated system frequency at the reporting time in the second calculation window, wherein, calculating synchrophasor for the voltage and current signals obtained from the second resampling comprises:

calculating synchrophasor for the voltage and current signals obtained from the second resampling in the second calculation window.

16. The system frequency measurement method according to claim 12, further comprising:

calculating rate of change of system frequency by using curve fitting based on the updated estimated system frequency.

* * * * *